(12) United States Patent
Cranford

(10) Patent No.: US 9,909,207 B1
(45) Date of Patent: Mar. 6, 2018

(54) ION VAPOR DEPOSITION OF ALUMINUM ON NON-METALLIC MATERIALS

(71) Applicant: Cametoid Technologies, Inc., Manchester, CT (US)

(72) Inventor: Timothy Cranford, Manchester, CT (US)

(73) Assignee: CAMETOID TECHNOLOGIES, INC., Manchester, CT (US)

( * ) Notice: Subject to any disclaimer, the term of this patent is extended or adjusted under 35 U.S.C. 154(b) by 391 days.

(21) Appl. No.: 14/828,708

(22) Filed: Aug. 18, 2015

(51) Int. Cl.
| | |
|---|---|
| *C23C 14/34* | (2006.01) |
| *C23C 14/20* | (2006.01) |
| *H05B 33/14* | (2006.01) |
| *B32B 15/08* | (2006.01) |
| *C09K 11/06* | (2006.01) |

(52) U.S. Cl.
CPC .......... *C23C 14/3442* (2013.01); *B32B 15/08* (2013.01); *C09K 11/06* (2013.01); *C23C 14/205* (2013.01); *C23C 14/345* (2013.01); *H05B 33/14* (2013.01)

(58) Field of Classification Search
CPC ........ B32B 15/08; C09D 5/185; H05B 33/14; B05D 7/14; C23C 14/3442; C23C 14/206; C23C 14/345
See application file for complete search history.

(56) References Cited

U.S. PATENT DOCUMENTS

| | | | |
|---|---|---|---|
| 4,963,237 A | 10/1990 | Olds et al. | |
| 8,895,115 B2 | 11/2014 | Gorokhovsky | |
| 2003/0042131 A1* | 3/2003 | Johnson et al. | .... C23C 14/3407 204/192.12 |
| 2014/0004352 A1* | 1/2014 | McCrea et al. | .......... C25D 5/50 428/416 |

OTHER PUBLICATIONS

Metals Handbook, Ninth Edition, vol. 5,—Surface Cleaning, Finishing, and Coating, "Metallic Coating Processes Other Than Plating," pp. 346-347, American Society for Metals, May 1990.
Enviro Tech International, Inc., EnSolv 5408 Material Safety Data Sheet, Jan. 2013.
Henkel Corporation, Alodine 1200S Material Safety Data Sheet, Sep. 2014.
PRC-Desoto International, Inc., Desoclean 45 Solvent Cleaner, Material Safety Data Sheet, Mar. 2000.

* cited by examiner

*Primary Examiner* — Nathan M Nutter
(74) *Attorney, Agent, or Firm* — Wiggin and Dana LLP; Gregory S. Rosenblatt

(57) ABSTRACT

A process to deposit a metallic coating on a non-metallic substrate by ion vapor deposition. The substrate is inserted into a stream of ions and vapor of the coating with a first side of the substrate facing a first electric grid. The substrate is at the same voltage potential as the first electric grid and a primer coating is deposited on the first side. The primer coated first side is next coated to a desired thickness by insertion into the ion stream with the substrate at a negative potential relative to the first grid. The substrate is then rotated so the second side is facing the first grid with the substrate at a negative potential relative the first grid for a time effective to deposit the coating to a desired thickness. One composite material is a laser sintered thermoplastic substrate with an aluminum or an aluminum base alloy coating.

16 Claims, 3 Drawing Sheets

ION VAPOR DEPOSITION OF ALUMINUM ON NON-METALLIC MATERIALS

CROSS REFERENCE TO RELATED APPLICATION(S)

N.A.

U.S. GOVERNMENT RIGHTS

The invention was not made with U.S. Government support under any contract.

BACKGROUND

Field of the Disclosure

This application relates to a process for the deposition of aluminum by ion vapor deposition (IVD), and more particularly to a process for the deposition of aluminum on to non-metallic and composite substrates, such as polyether ether ketone (PEEK) or polyether ketone ketone (PEKK).

Description of the Related Art

IVD is a coating process achieved by applying a negative potential voltage between a part being coated and a source of evaporation. An inert gas is introduced into a vacuum system and becomes ionized. An evaporated coating material, such as aluminum, passes through a glow discharge region, becomes ionized and is accelerated toward the part to be coated. The resultant coating is disclosed to be denser and with better adhesion when compared to conventional vacuum metallization.

U.S. Pat. No. 4,963,237, titled "Method for Electrochemical Activation of IVD Aluminum Coatings" by Olds et al., discloses applying a coating of aluminum/zinc alloy to a steel substrate and a coating of aluminum/manganese alloy to an aluminum substrate by IVD. In the first instance, rather than independent evaporating boats for the aluminum and zinc, an aluminum feed wire is either coated with zinc or an alloy of aluminum and zinc is formed into a feed wire. In the second instance, an aluminum feed wire is alloyed with manganese. The disclosure of U.S. Pat. No. 4,963,237 is incorporated by reference herein in its entirety.

U.S. Pat. No. 8,895,115, titled "Method for Producing an Ionized Vapor Deposition Coating" by Gorokhovsky, discloses applying a coating of titanium nitride to a stainless steel substrate by IVD. Process steps include cleaning substrates in a solvent, loading substrates into a process chamber and drawing a vacuum on the process chamber to a pressure of between $1\times10^{-5}$ torr-$1\times10^{-6}$ torr. The substrates are then electrically biased to a bias power in the range of 50 watts (W) to 150 W and a neutral (argon) process gas ionized to facilitate substrate cleaning. A metal vapor of the desired coating is then formed and combined with the ionizing process gas to form a metal sputtering flow. The bias power is reduced to 50 W and up to 10% partial pressure of a second gas added for coating. The disclosure of U.S. Pat. No. 8,895,115 is incorporated by reference herein in its entirety.

U.S. Pat. No. 4,963,237 and U.S. Pat. No. 8,895,115 disclose processes for the deposition of a coating onto a metallic substrate by IVD. As shown in FIG. 3A, when a similar process is used for coating a non-metallic substrate by IVD, the coating develops nodules and pitting indicative of poor coverage and is visually unappealing. There remains, therefore, a need for a process for the IVD coating of a non-metallic substrate that does not result in nodules and pitting as exemplified by the prior art processes.

BRIEF SUMMARY

The details of one or more embodiments of the invention are set forth in the accompanying drawings and the description below. Other features, objects and advantages of the invention will be apparent from the description and drawings, and from the claims.

Disclosed herein is a process to deposit a metallic coating on non-metallic and composite substrates having opposing first and second sides. This process includes the steps of (a). electrically interconnecting the substrate to an electrically conductive fixture that fixes the substrate in a desired orientation; (b). creating an ion stream between a first electric grid and a second electric grid wherein the second electric grid has a negative potential relative to the first electric grid; (c). inserting vapor particles of the metallic coating into the ion stream; (d). inserting the substrate into the vapor stream with the first side of the substrate facing the first electric grid with the substrate at the same potential as the first grid for a time effective to deposit a primer coating on the first side; (e). removing the substrate from the vapor stream, impressing the substrate with a negative potential relative to the first electric grid and reinserting the substrate into the vapor stream with the primer coated first side facing the first electric grid for a time effective to deposit the metallic coating to a desired thickness; (f). rotating the substrate so the second side of the substrate is facing the first electric grid; and (g). inserting the substrate into the vapor stream with the second side of the substrate facing the first electric grid with the substrate at a negative potential relative to the first grid for a time effective to deposit the metallic coating to a desired thickness.

One composite material formed by this process has a laser sintered thermoplastic substrate with a coating of aluminum or an aluminum base alloy adhering to the substrate. Exemplary thermoplastic substrates are PEEK and PEKK.

BRIEF DESCRIPTION OF THE DRAWINGS

Like reference numbers and designations in the various drawings indicated like elements.

DETAILED DESCRIPTION

Figure 1:
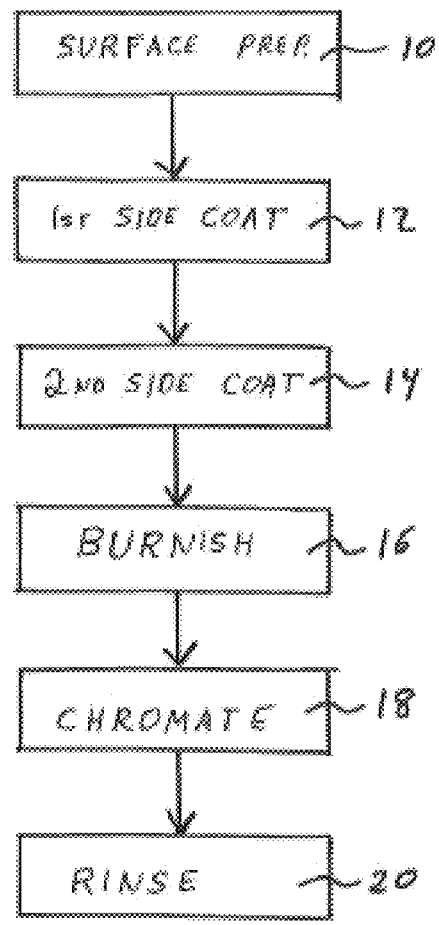
FIG. 1 illustrates process steps disclosed herein in flow chart representation.

FIG. 1 is a flow chart of process steps effective to apply a coating to a non-metallic substrate by IVD. Representative substrates are formed from a thermoplastic or thermoset polymer. Typically, the substrates are formed to a desired finished shape or near finished shape prior to coating. The substrates are usually formed by three dimensional printing, or a similar additive process, and then laser sintered to densify. Preferred polymers for the substrates are laser sintered organic thermoplastic polymers, such as PEEK and PEKK. One coating is an aluminum base alloy, where base means that the alloy, by weight, is more than 50% aluminum. A preferred coating has a minimum of 99.5%, by weight, aluminum and the balance one or more of iron, silicon, zinc and gallium.

Surface preparation 10 includes cleaning and/or degreasing the substrates using an appropriate cleanser/degreaser that is chemically inert to the parts. For PEEK and PEKK parts, suitable cleanser/degreaser agents are ARDOX® 5515 (Chemetall US, Inc., New Providence, N.J.) that contains a mixture of Sec-Butyl Alcohol and 2-Butanon and Ensolv 5408 (Enviro Tech International, Melrose Park Ill.) that contains n-Propyl Bromide ($C_3H_7Br$) and stabilizers. The surfaces of the parts are further cleaned and roughened for improved coating adhesion by grit blasting. To avoid damaging the surface finish of the parts and to avoid changing part tolerances, 220 grit aluminum oxide (or finer) at a pressure of 60 pounds per square inch (or less) is used for grit blasting. If portions of the parts are to remain uncoated, those portions may be masked with a suitable heat and pressure sensitive tape or hard masking either before or after grit blasting. Following grit blasting, excess grit is removed by blasting with clean, dry compressed air followed by a secondary rinse with the cleaner/degreaser.

Shortly after the secondary rinse, the parts are coated. Shortly refers to a nominal dwell time of between 30 minutes and 4 hours from when the secondary rinse concludes until the coating begins. Coating is a two-step process. A first side of each part is coated followed by a second side of each part being coated. As disclosed below, the first side coating sequence 12 includes both coating with no voltage applied to the parts and coating with a voltage applied to the parts. The second side coating sequence 14 includes coating only when a voltage is applied to the parts.

Figure 2:
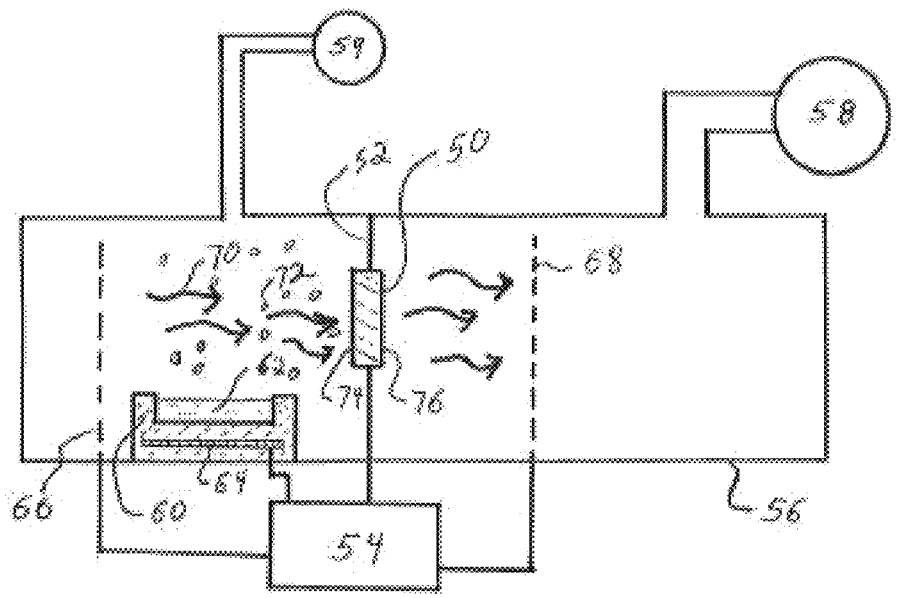
FIG. 2 schematically illustrates a process chamber for IVD deposition.

Referring to FIG. 2, during the first side coating sequence, the parts 50 are supported by a fixture 52 having electrically conductive contacts that electrically interconnect the parts 50 to a power supply 54. The fixtured parts 50 are inserted into a process chamber 56 and a vacuum pump 58 reduces the pressure in the process chamber 56 to less than 6 microns ($6 \times 10^{-3}$ torr). An inert gas supply 59, such as argon, is used to purge the process chamber 56 and to provide a source of ions, as described below. A ceramic reservoir 60 containing a coating metal 62 utilizes heating coils 64 to heat the coating metal to a temperature above its vaporization temperature. For a high purity aluminum alloy, the vaporization temperature is between 660° C. and 2467° C. A wire feeder mechanism (not shown) provides additional coating metal 62 to the ceramic reservoir 60 to replace vaporized metal.

The power supply 54 then impresses a voltage bias between a first electrical grid 66 and a second electrical grid 68 with the second electrical grid 68 being negative relative to the first electrical grid. The fixtured parts 50 remain at about the same voltage potential as the first electrical grid 66 so that there is a voltage differential of no more than 100 volts between the first electrical grid 66 and the fixtured parts 50. More preferably, the voltage differential is less than 50 volts and most preferably, there is no voltage differential. A stream of inert aluminum gas ions 70 flows to the negatively charged second electrical grid 68. Vapor droplets 72 of the coating metal 62 are caught up in the stream of inert gas ions 70 and impact a first side 74 of the fixtured parts 50.

After an initial coating layer of about 0.00015 inch is deposited on the first side of the fixtured parts, a low voltage differential of between 300-800 volts is impressed between the first electrical grid and the fixtured parts with the fixture parts being more negative. A cooling cycle is introduced following the first pass. The parts are cooled under an inert gas, such as nitrogen, for about 5 minutes to lower the part temperature such that the part temperature does not exceed 150° C. Following the cooling cycle, up to Five additional coating passes through the ion gas stream with vapor droplets are conducted with the low voltage differential in place, which includes a nitrogen cooling cycle in between every complete coating pass. The cooling cycle is intended to prevent the overheating of the substrate and allow for stronger adhesion of the coating metal. After the six coating cycles, the first side of the part will have a coating thickness of about 0.0015 inch. The total dwell time in the ion stream for 6 coating cycles is about 28 minutes. Because the first side of the part shields the second side from the ion stream while allowing for minimal wrap around, the second side will be virtually uncoated. The components inside the process chamber are allowed to cool such that the parts will be below 148.9° C. and then the internal pressure is returned to ambient pressure and the process chamber opened. The fixtured parts are then rotated 180° relative to the first electrical grid so that the uncoated side is now facing the coating mechanism and the process chamber returned to a vacuum pressure of about 6 microns.

Second side coating includes another six coating cycles with a dwell time in the ion stream of about 28 minutes. During the coating of the second side, the fixture parts are at a negative potential relative to the first electrical grid for all six coating cycles, rather than the initial cycle at a zero voltage differential as described above for the first side of coating. The components of the process chamber are again cooled under inert gas, such as nitrogen for about 5 minutes, after every complete coating pass to ensure prevent the overheating of the substrate. After the final pass, the part temperature will be less than 150° C., the process chamber is vented and the parts removed. The coating thickness on the second side of the parts after the 6 coating cycles is about 0.0015 inch.

Referring back to FIG. 1, the coating is then densified by burnishing 16 with a media, such as glass beads. Exemplary is #10 (0.0035-0.0059 inch diameter) glass beads directed at the part at a maximum pressure of 20 pounds per square inch, burnishing continuously for about 5 seconds. The parts are then blown clean using clean, dry air at about 15-20 psi. Following burnishing, the parts are inspected to verify coating thickness and adhesion.

To increase electrical conductivity and to provide maximum corrosion protection, the coated parts may receive a supplementary chemical conversion treatment 18 by immersion into a chemical conversion bath for from 10 to 15 seconds for low electrical resistance, or 30 seconds to provide maximum corrosion protection. An exemplary chemical conversion coating bath contains Hexavalent Chromate. One exemplary coating is Alodine 1200S (Henkel Corporation, Rocky Hill, Conn.) that contains a mixture of chromium (VI) oxide, potassium tetrafluroborate, tripotassium hexacyanoferrate, sodium fluoride and dipotassium hexafluorozirconate. Following chromate treatment, the parts are rinsed and dried 20 and then subjected to a final inspection to measure electrical conductivity. Unless otherwise directed, the chromate conversion parts should dwell for a period of time of between 12-24 hours prior to packaging and shipment.

Figure 4:
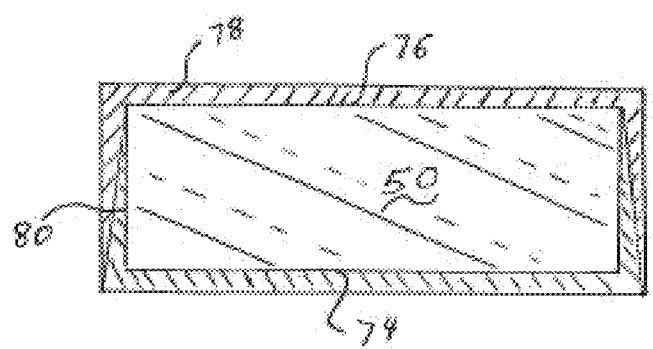
FIG. 4 is a cross-sectional representation of a substrate coated according to the process of FIG. 1.

FIG. 4 is a cross-sectional representation of a substrate 50 coated according to the process of FIG. 1. An exemplary substrate 50 is a laser sintered non-metallic or composite substrate such as PEEK or PEKK. The coating 78 is aluminum or an aluminum base alloy. The microstructure of the coating is commensurate with having been deposited by IVD. This can be seen by viewing the edges 80 of the coated substrate where the coating 78 tapers from full thickness to minimal thickness when deposited from either the first side 74 or the second side 76. The combined effect of coating from both sides leads to sufficient thickness of coating along the entire edge 80.

Example

The following Example illustrates the benefits the process disclosed herein. Two test panels were prepared according to the following process steps. All steps not listed below, were identical for both test panels. The dwell time for each coating cycle was 4-6 minutes. The voltage of the part relative to the first electric gird is as shown. While a glow discharge at a voltage of 600-1200 volts was used to purge foreign material from the parts under the conventional process, the glow discharge was omitted from the process disclosed herein.

|  | Glow Discharge | Coating Cycle | | | | | |
| --- | --- | --- | --- | --- | --- | --- | --- |
|  |  | 1-Front | 2-Front | 3-Front | 4-Front | 5-Front | 6-Front |
| Panel A Voltage | 600-1200 | 300-800 | 300-800 | 300-800 | 300-800 | 300-800 | 300-800 |
| Panel B Voltage | -0- | -0- | 300-800 | 300-800 | 300-800 | 300-800 | 300-800 |

|  | Coating Cycle | | | | | |
| --- | --- | --- | --- | --- | --- | --- |
|  | 1-Back | 2-Back | 3-Back | 4-Back | 5-Back | 6-Back |
| Panel A Voltage | -0- | 300-800 | 300-800 | 300-800 | 300-800 | 300-800 |
| Panel B Voltage | -0- | 300-800 | 300-800 | 300-800 | 300-800 | 300-800 |

Figure 3A:
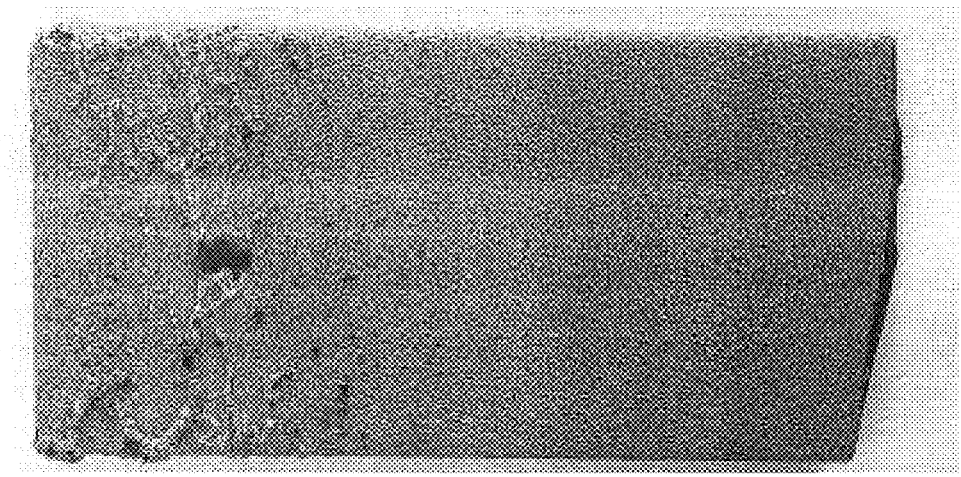
FIG. 3A illustrates coated substrates in accordance with a prior art coating process.
Figure 3B:
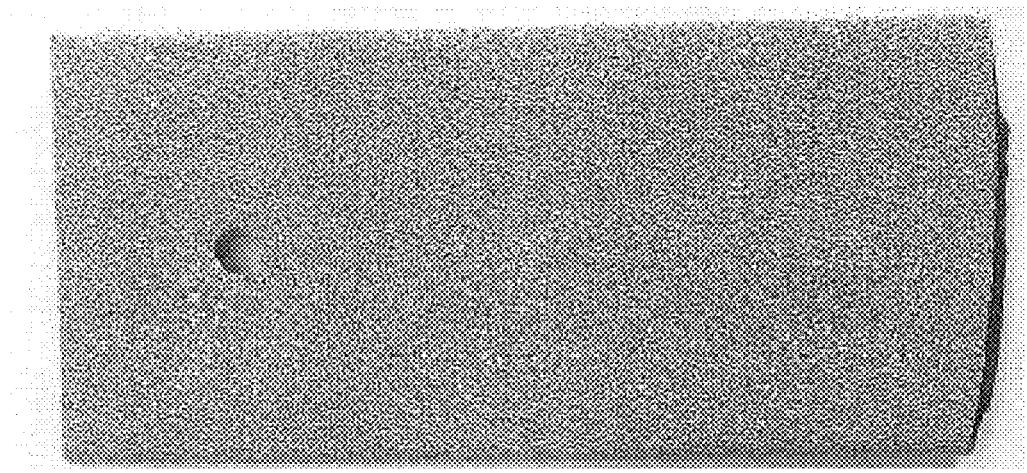
FIG. 3B illustrates coated substances in accordance with the coating process of FIG. 1.

With reference to FIGS. 3A and 3B, by utilizing the process disclosed herein, a smooth coating is achieved as shown in FIG. 3B. The nodules and pitting associated with prior processes as shown in FIG. 3A is avoided.

One or more embodiments of the present invention have been described. Nevertheless, it will be understood that various modifications may be made without departing from the spirit and scope of the invention. For example, if an electrical current is present during the first coating pass, the integrity of the PEKK or PEEK material will be negatively affected, resulting in an unsuccessful coating application. Accordingly, other embodiments are within the scope of the following claims.

What is claimed is:

1. A process to deposit an aluminum or aluminum-base alloy metallic coating on a non-metallic substrate having opposing first and second sides, comprising the steps of:
   (a). electrically interconnecting said substrate to an electrically conductive fixture that fixes said substrate in a desired orientation;
   (b). creating an ion stream between a first electric grid and a second electric grid wherein said second electric grid has a negative potential relative to said first electric grid;
   (c). inserting vapor particles of said metallic coating into said ion stream;
   (d). inserting said substrate into said vapor stream with said first side of said substrate facing said first electric grid with said substrate at a voltage potential within 50 volts of said first grid for a time effective to deposit a primer coating on said first side;
   (e). removing said substrate from said vapor stream, impressing said substrate with a negative potential relative to said first electric grid and reinserting said substrate into said vapor stream with said primer coated first side facing said first electric grid for a time effective to deposit said metallic coating to a desired thickness;
   (f). rotating said substrate so said second side of said substrate is facing said first electric grid; and
   (g). inserting said substrate into said vapor stream with said second side of said substrate facing said first electric grid with said substrate at a negative potential relative said first grid for a time effective to deposit said metallic coating to a desired thickness.

2. The process of claim 1 wherein said non-metallic substrate is selected to be a laser sintered thermoplastic.

3. The process of claim 2 wherein said non-metallic substrate is selected from the group consisting of polyether ether ketone (PEEK) and polyether ketone ketone (PEKK).

4. The process of claim 3 wherein prior to step (a), said opposing first and second sides of said substrate are roughened.

5. A process to deposit an aluminum or aluminum-base alloy metallic coating on a laser-sintered thermoplastic substrate selected from the group consisting of polyether ether ketone (PEEK) and polyether ketone ketone (PEKK) having opposing first and second sides, comprising the steps of:
   (a). roughening opposing first and second sides of said substrate by grit blasting with 220 grit or finer aluminum oxide at a maximum pressure of 60 pounds per square inch;
   (b). electrically interconnecting said substrate to an electrically conductive fixture that fixes said substrate in a desired orientation;
   (c). creating an ion stream between a first electric grid and a second electric grid wherein said second electric grid has a negative potential relative to said first electric grid;
   (d). inserting vapor particles of said metallic coating into said ion stream;
   (e). inserting said substrate into said vapor stream with said first side of said substrate facing said first electric grid with said substrate at a voltage potential within 100 volts of said first grid for a time effective to deposit a primer coating on said first side;
   (f). removing said substrate from said vapor stream, impressing said substrate with a negative potential relative to said first electric grid and reinserting said substrate into said vapor stream with said primer coated first side facing said first electric grid for a time effective to deposit said metallic coating to a desired thickness;

(g). rotating said substrate so said second side of said substrate is facing said first electric grid; and (h). inserting said substrate into said vapor stream with said second side of said substrate facing said first electric grid with said substrate at a negative potential relative said first grid for a time effective to deposit said aluminum or aluminum-base alloy coating to a desired thickness.

6. A process to deposit an aluminum or aluminum-base alloy metallic coating on a laser-sintered thermoplastic substrate selected from the group consisting of polyether ether ketone (PEEK) and polyether ketone ketone (PEKK) having opposing first and second sides, comprising the steps of:

(a). roughening opposing first and second sides of said substrate;

(b). electrically interconnecting said substrate to an electrically conductive fixture that fixes said substrate in a desired orientation;

(c). creating an ion stream between a first electric grid and a second electric grid wherein said second electric grid has a negative potential relative to said first electric grid;

(d). inserting vapor particles of said metallic coating into said ion stream within from 30 minutes to 4 hours following completion of said roughening;

(e). inserting said substrate into said vapor stream with said first side of said substrate facing said first electric grid with said substrate at a voltage potential within 100 volts of said first grid for a time effective to deposit a primer coating on said first side;

(f). removing said substrate from said vapor stream, impressing said substrate with a negative potential relative to said first electric grid and reinserting said substrate into said vapor stream with said primer coated first side facing said first electric grid for a time effective to deposit said metallic coating to a desired thickness;

(g). rotating said substrate so said second side of said substrate is facing said first electric grid; and (h). inserting said substrate into said vapor stream with said second side of said substrate facing said first electric grid with said substrate at a negative potential relative said first grid for a time effective to deposit said aluminum or aluminum-base alloy coating to a desired thickness.

7. A process to deposit an aluminum or aluminum-base alloy metallic coating on a laser-sintered thermoplastic substrate selected from the group consisting of polyether ether ketone (PEEK) and polyether ketone ketone (PEKK) having opposing first and second sides, comprising the steps of:

(a). roughening opposing first and second sides of said substrate;

(b). electrically interconnecting said substrate to an electrically conductive fixture that fixes said substrate in a desired orientation;

(c). creating an ion stream between a first electric grid and a second electric grid wherein said second electric grid has a negative potential relative to said first electric grid;

(d). inserting vapor particles of said metallic coating into said ion stream;

(e). inserting said substrate into said vapor stream with said first side of said substrate facing said first electric grid with said substrate at a voltage potential within 100 volts of said first grid for a time effective to deposit a primer coating on said first side;

(f). repeating step (e) multiple times with a cooling cycle inserted prior to at least one of said repetitions;

(g). removing said substrate from said vapor stream, impressing said substrate with a negative potential relative to said first electric grid and reinserting said substrate into said vapor stream with said primer coated first side facing said first electric grid for a time effective to deposit said metallic coating to a desired thickness;

(h). rotating said substrate so said second side of said substrate is facing said first electric grid; and (i). inserting said substrate into said vapor stream with said second side of said substrate facing said first electric grid with said substrate at a negative potential relative said first grid for a time effective to deposit said aluminum or aluminum-base alloy coating to a desired thickness.

8. The process of claim 7 including repeating step (i) multiple times with a cooling cycle inserted prior to at least one of said repetitions.

9. The process of claim 8 including burnishing said first and second opposing sides of said substrate after completing of step (i).

10. The process of claim 9 including immersing said substrate in a chromate conversion solution subsequent to said burnishing step.

11. The process of claim 10 wherein immersion in said chromate conversion solution is for a time effective to successfully provide low electrical resistance and provide maximum corrosion protection.

12. A composite material formed by the process of claim 1, the composite material having:

a laser sintered non-metallic substrate;

a coating adhering directly to said laser sintered non-metallic substrate, said coating selected from the group consisting of aluminum and aluminum base alloys.

13. The composite material of claim 12 wherein said laser sintered non-metallic substrate is selected from the group consisting of polyether ether ketone (PEEK) and polyether ketone ketone (PEKK).

14. The composite material of claim 13 wherein said coating has a microstructure commensurate with having been deposited by ion vapor deposition (IVD).

15. The composite material of claim 14 wherein said coating has a microstructure commensurate with having been deposited by multiple IVD coating steps.

16. The composite material of claim 14 wherein there are not intervening materials between said laser sintered non-metallic substrate and said coating.

* * * * *